United States Patent
Cho (10) Patent No.: US 7,525,371 B2
(45) Date of Patent: Apr. 28, 2009

(54) MULTI-THRESHOLD CMOS SYSTEM AND METHODS FOR CONTROLLING RESPECTIVE BLOCKS

(75) Inventor: Sung-Hoon Cho, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 397 days.

(21) Appl. No.: 11/294,356

(22) Filed: Dec. 6, 2005

(65) Prior Publication Data

US 2006/0181306 A1  Aug. 17, 2006

(30) Foreign Application Priority Data

Feb. 11, 2005 (KR) ............... 10-2005-0011666

(51) Int. Cl.
 *G05F 1/10* (2006.01)
 *H03K 19/0175* (2006.01)
(52) U.S. Cl. ............... 327/544; 327/200; 327/215; 326/82; 326/83; 326/81
(58) Field of Classification Search ............. 326/38–41, 326/93, 95, 98, 56–58, 81; 327/544
See application file for complete search history.

(56) References Cited

U.S. PATENT DOCUMENTS 5,486,774 A  1/1996  Douseki et al.
6,169,418 B1 *  1/2001  Wagner ............... 326/41
6,501,300 B2 *  12/2002  Hatae ............... 326/93
2001/0052800 A1 *  12/2001  Mizuno ............... 327/1
2006/0076987 A1 *  4/2006  Won ............... 327/112

OTHER PUBLICATIONS

Horgan, Jack, "Low Power Soc Design", EDACafe Weekly Magazine, (May 17-21, 2004).

* cited by examiner

*Primary Examiner*—Vibol Tan
(74) *Attorney, Agent, or Firm*—Lee & Morse, P.C.

(57) ABSTRACT

A multi-threshold CMOS system and method controls a state of respective blocks individually. Each block includes a logic circuit having a logic transistor and a control transistor connected between the logic circuit and a power line connected to one of a ground and a power source. The control transistor has a higher threshold than the logic transistor. The blocks are controlled by generating an individual block ON/OFF signal for each block, generating an individual control signal in response to the individual block ON/OFF signal, supplying the individual control signal to the control transistor and controlling voltage supply to the logic circuit within each block in accordance with the individual control signal.

24 Claims, 9 Drawing Sheets

MULTI-THRESHOLD CMOS SYSTEM AND METHODS FOR CONTROLLING RESPECTIVE BLOCKS

BACKGROUND OF THE INVENTION

1. Field of the Invention

The present invention relates to a multi-threshold complementary metal oxide silicon (MTCMOS) circuit. More particularly, the present invention relates to a MTCMOS system and methods for controlling respective blocks.

2. Description of the Related Art

With increased integration of semiconductor devices, demand for low power consumption has also increased. One method of implementing a low power integrated circuit (IC) includes reducing the power supply voltage. However, reducing the power supply voltage reduces the speed of transistors in the IC. Thus, the threshold voltage Vth of the transistors may be reduced. However, reducing the Vth may increase the leakage current of the transistors, which increases power consumption when the device is in a standby state. This can be of particular importance in devices having a high standby-to-active ratio, e.g., mobile or portable devices, in which leakage current may be the dominant factor in determining overall battery life.

One solution involves using a multi-threshold CMOS (MTCMOS) system, which uses both high and low Vth transistors. More particularly, the MTCMOS system uses low Vth transistors to implement gates at high speed and high Vth transistors to form virtual gates and suppress the leakage current when the device is in a standby mode. In other words, the low Vth transistors are used for logic operations and the high Vth transistors are used to supply power and/or ground voltages.

In an active mode, the high Vth transistors are turned on to supply the power voltage to the logic gates, allowing the low Vth transistors to operate at high speed. In a standby mode, the high Vth transistors are turned off to cut off the low Vth transistors, thereby reducing or eliminating the leakage current through the low Vth transistors.

Figure 1:
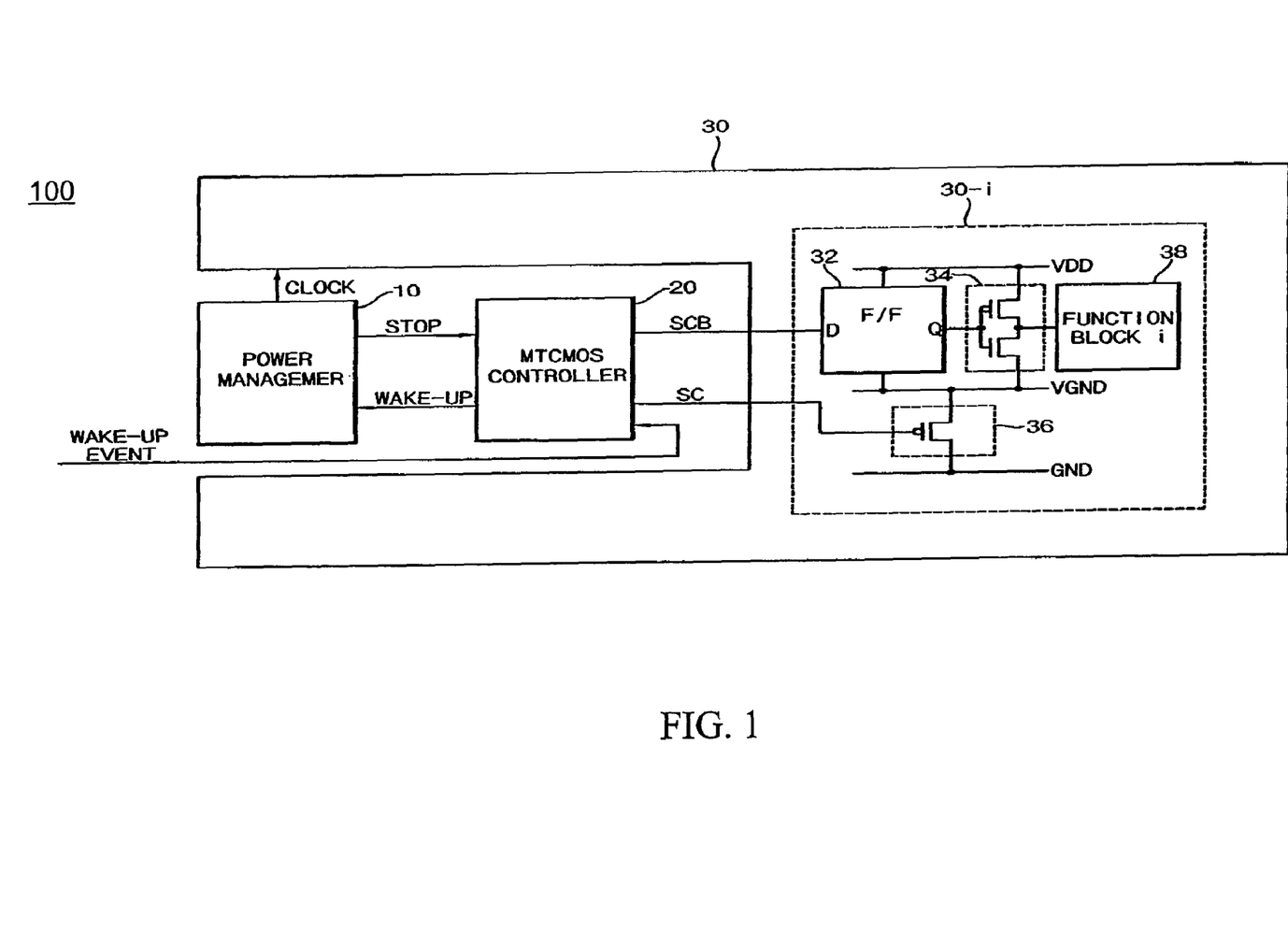
FIG. 1 illustrates a block diagram of a conventional MTCMOS system.

FIG. 1 illustrates a block diagram of a conventional MTCMOS system 100. The MTCMOS system 100 includes a system power manager 10, an MTCMOS controller 20 and an MTCMOS design area 30. The MTCMOS design area 30 includes a plurality of blocks 30-i. Each block 30-i includes a flip/flop (F/F) 32, a logic block 34, a MOS switch 36 and a function block 38. The MOS switch 36 has a higher Vth than the logic block 34. The F/F 32 and the logic block 34 are connected between a power source (VDD) and a virtual ground (VGND). The MOS switch 36 is connected between a ground voltage (GND) and VGND.

In an active mode, the MOS switch 36 is turned on to supply VDD or GND to the logic block 34. In a standby mode, the MOS switch 36 is turned off to interrupt VDD and/or GND to the logic block 34, thereby reducing a leakage current of the logic block 34 and minimizing power consumption of the system.

When the system enters the standby mode, the power manager 10 sends STOP and do not send CLOCK signals to the MTCMOS controller 20 and the MTCMOS design area 30, respectively. In response to the STOP signal, the MTCMOS controller 20 outputs a control signal SC for controlling the MOS switch 36 and a control signal SCB (inverted SC) for controlling the F/F 32. When VDD is cut off, the voltage level of VGND floats. To prevent loss of data stored in the logic block 34, the data is stored in the F/F 32 in response to SCB before turning off the MOS switch 36 in response to SC.

In many systems, e.g., mobile systems, typically only some functions are activated, while the rest remain deactivated. However, the conventional MTCMOS system only enters standby mode when the entire system is not operated. Thus, the conventional MTCMOS cannot control individual blocks and cannot reduce power consumption when only certain blocks need to be activated.

SUMMARY OF THE INVENTION

The present invention is therefore directed to an MTCMOS system and method, which substantially overcome one or more of the problems due to the limitations and disadvantages of the related art.

It is therefore a feature of an embodiment of the present invention to provide an MTCMOS system and method that controls respective functional blocks.

It is another feature of an embodiment of the present invention to provide an MTCMOS system and method that reduces power consumption when only specified functions are performed.

It is still another feature of an embodiment of the present invention to provide a floating protection circuit between blocks.

At least one of the above and other feature and advantages of the present invention may be realized by providing a method of controlling a plurality of blocks. Each block includes a logic circuit having a logic transistor and a control transistor connected between the logic circuit and a power line connected to one of a ground and a power source, the control transistor having a higher threshold than the logic transistor. The method includes generating an individual block ON/OFF signal for each block, generating an individual control signal in response to the individual block ON/OFF signal, supplying the individual control signal to the control transistor and controlling a voltage supplied to the logic circuit within each block in accordance with the individual control signal.

The method may further include buffering, for each block, an output of the logic circuit when the block is in an ON state and controlling buffering in accordance with an inverted individual control signal. The method may further include delaying the inverted individual control signal relative to the individual control signal when the block is to be turned ON and delaying the individual control signal relative to the inverted individual control signal when the block is to be turned OFF.

Before outputting the individual control signal, the method may include sending a request signal to a corresponding block in response to the individual block ON/OFF signal and sending a response signal from the corresponding block when it is ready to receive the individual control signal.

The method may further include generating a block select signal in accordance with the response signal and controlling generating the individual control signal in accordance with the block select signal.

The supplying the individual control signal may be in response to a wake-up event.

The method may further include, when a block is in an OFF state, preventing leakage current from the block from affecting other blocks. The method may further include supplying an output of the logic circuit of the block to a bus holder when the block is in an OFF state. Supplying the output of the logic circuit may be controlled in accordance with an inverted individual control signal.

At least one of the above and other feature and advantages of the present invention may also be realized by providing a system including a plurality of blocks, each block including a logic circuit having a logic transistor and a control transistor connected between the logic circuit and a power line connected to one of a ground and a power source, the control transistor having a higher threshold than the logic transistor, a power manager for outputting an individual block ON/OFF signal for each block and a control circuit for receiving the individual block ON/OFF signal for each block and for outputting an individual control signal to the control transistor in that block to control voltage supply to the logic circuit.

Each block may include a buffer in parallel with the logic circuit, and the control circuit further outputs an inverted individual control signal to the buffer. The system may further include a first delay for delaying the inverted individual control signal relative to the individual control signal when the block is to be turned ON and a second delay for delaying the individual control signal relative to the inverted individual control signal when the block is to be turned OFF.

The control circuit, before outputting the individual control signal, may further output a request signal to a corresponding block in response to the individual block ON/OFF signal and each block sends a response signal when it is ready to receive the individual control signal. The control circuit may include a block controller, receiving the individual block ON/OFF signals from the power manager, for sending the request signal to the corresponding block, receiving the response signal from the corresponding block, and outputting a block select signal, and a state controller, receiving the block select signal, for outputting the individual control signal in accordance with the block select signal.

The control circuit may output the individual control signal in response to a wake-up event and a wake-up signal to the power manager in response to the wake-up event, after the output of the individual control signal.

The system may include a floating protection circuit associated with a block. The floating protection circuit may include a tri-state buffer receiving an inverted individual control signal from the control circuit and an output of the logic circuit of a corresponding block and outputting the output of the logic circuit in accordance with the inverted individual control signal and a bus holder receiving the output of the tri-state buffer. The system may include a pair of floating protection circuits between adjacent blocks.

At least one of the above and other feature and advantages of the present invention may also be realized by providing a system for protecting first and second blocks, each block including a logic circuit and having ON/OFF states which are individually controlled, the system being between the first and second blocks, the system including a first tri-state buffer for receiving a first output of the logic circuit of the first block and a first inverted control signal for the first block, and outputting the first output in accordance with the first inverted control signal, a first bus holder for receiving the output of the first tri-state buffer, a second tri-state buffer for receiving a second output of the logic circuit of the second block and a second inverted control signal for the second block, and outputting the second output in accordance with the second inverted control signal, and a second bus holder for receiving the output of the second tri-state buffer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

Figure 2:
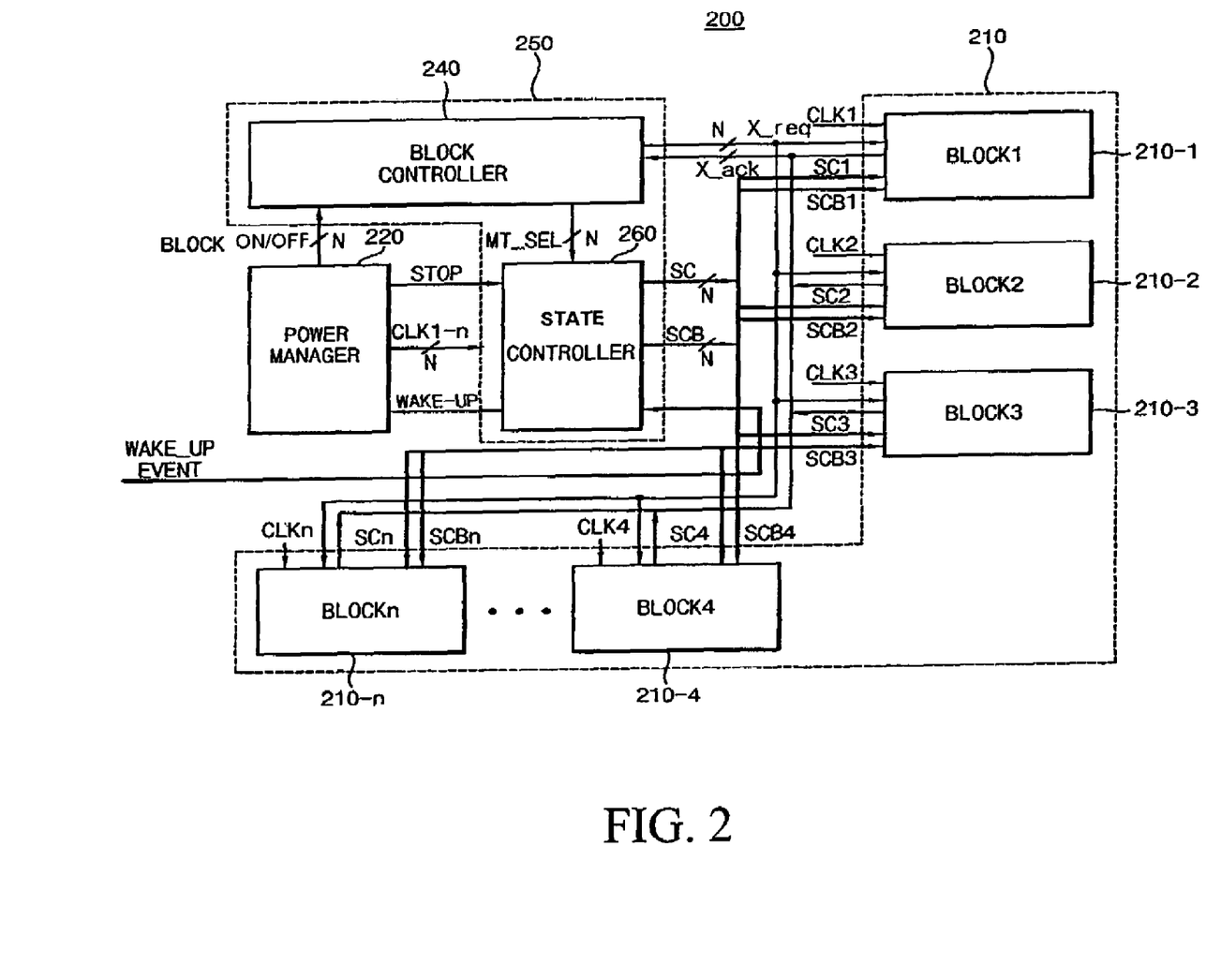
FIG. 2 illustrates a block diagram of an MTCMOS system according to an embodiment of the present invention.

FIG. 2 illustrates an MTCMOS system 200 in accordance with an embodiment of the present invention. The MTCMOS system 200 may include a power manager 220, an MTCMOS controller block 250 including a block controller 240 and a state controller 260, and an MTCMOS design area 210 having a plurality of blocks 210-$i$.

Figure 3:
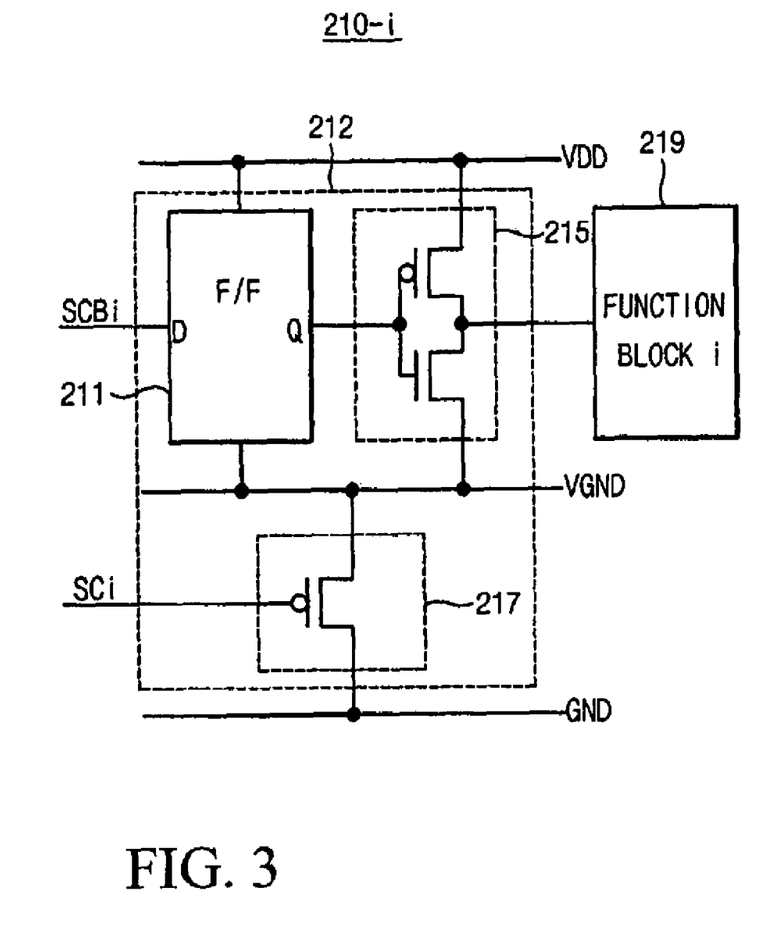
FIG. 3 illustrates a detailed block diagram of a block in the MTCMOS design area of FIG. 2 according to an embodiment of the present invention.

As can be seen in FIG. 3, each block 210-$i$ may include a flip-flop (F/F) 211, a logical circuit 215, a MOS switch 217 and a function block i 219. The MOS switch 217 has a higher Vth than the logical circuit 215.

The F/F 211 and the logical circuit 215 may be connected between a power source (VDD) and a virtual ground (VGND). The MOS switch 217 may be connected between a ground voltage (GND) and VGND.

In response to a Wake-up Event, the state controller 260 may generate control signals SC and inverted control signals SCB in accordance with a number of respective blocks to be controlled and a WAKE_UP signal. In the particular example shown in FIG. 2, each block 210-$i$ is to be individually controlled. Therefore, the number of control signals and inverted control signals is equal to the number of blocks n.

The power manager 220 may generate a stop signal STOP, a plurality of clock signals CLK1-$n$ to be output to the state controller 260 and an individual block signal BLOCKi ON/OFF to be output to the block controller 240, and may receive a wake up signal from the state controller 260. The block controller 240 may send a request signal X_reqi to corresponding blocks in response to BLOCKi ON/OFF. A corresponding block 210-$i$ may send a response signal X_acki to the block controller 240 once the block 210-$i$ finishes its current operation. The block controller 240 may then send block select signals MT_SELi to the state controller 260 in response to the X_acki received from the blocks. The state controller 260 supplies or cuts off a power voltage VDD to specified blocks 210-*i* based on control signals corresponding to MT_SELi signals.

To deactivate a specified block 210-*i*, the power manager 220 outputs STOP to the state controller 260, then the state controller 260 sends the control signals SCi and SCBi to a corresponding block 210-*i* in response to MT_SELi from the block controller 240. When the MOS switch 217 is turned off in response to SCi, the VGND is floated and data stored in the logic circuit 215 are lost. The data may be stored in the F/F 211 in response to SCBi before turning off the MOS switch 217, i.e., the SCB signal is turned to logic low before the SCi signal is turned to logic high.

To activate a specified block 210-*i*, the state controller 260 outputs WAKE-UP to the power manager 220 and sends SCi and SCBi to the blocks in response to MT_SELi. The data stored in the F/F 211 may be recovered, i.e., the SCi signal is changed to logic low before the SCBi signal is changed to logic high. Thus, the MTCMOS system 200 can reduce power consumption when only some functions are being utilized.

Figure 4:
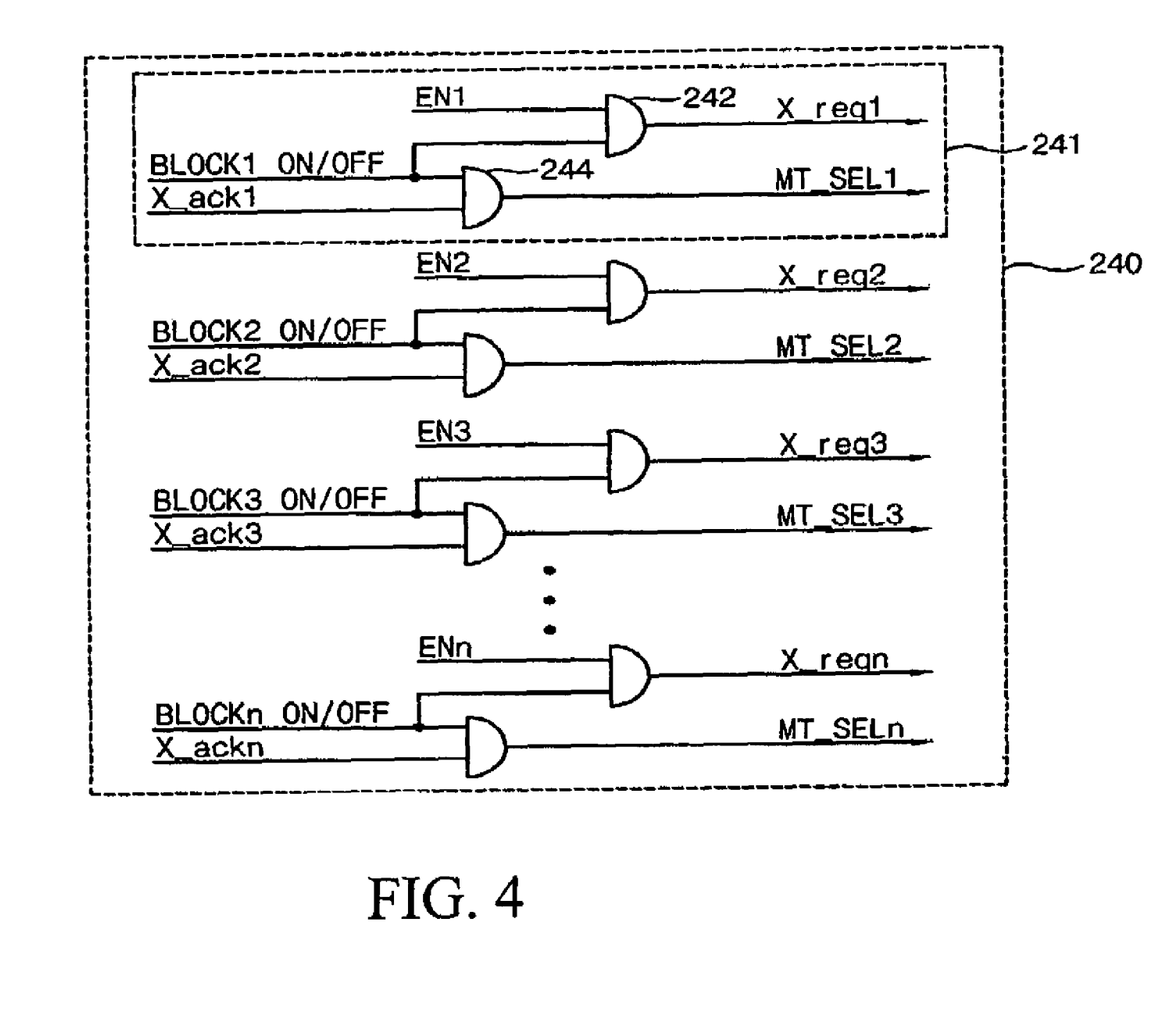
FIG. 4 illustrates a schematic diagram of the block controller of FIG. 2 according to an embodiment of the present invention.

A particular embodiment of the block controller 240 is shown in FIG. 4. As can be seen therein, the block controller 240 may include a plurality of block selection signal generators 241. Each block signal generator 241 may include a first AND gate 242 and a second AND gate 244. The first AND gate 242 may perform an AND operation of an enable signal EN, which is logic high, and the BLOCK ON/OFF signal. The AND gate 244 may perform an AND operation of X_acki and BLOCKi ON/OFF. The AND gate 242 may output X_reqi to the corresponding block when the corresponding block is to be activated.

Figure 5:
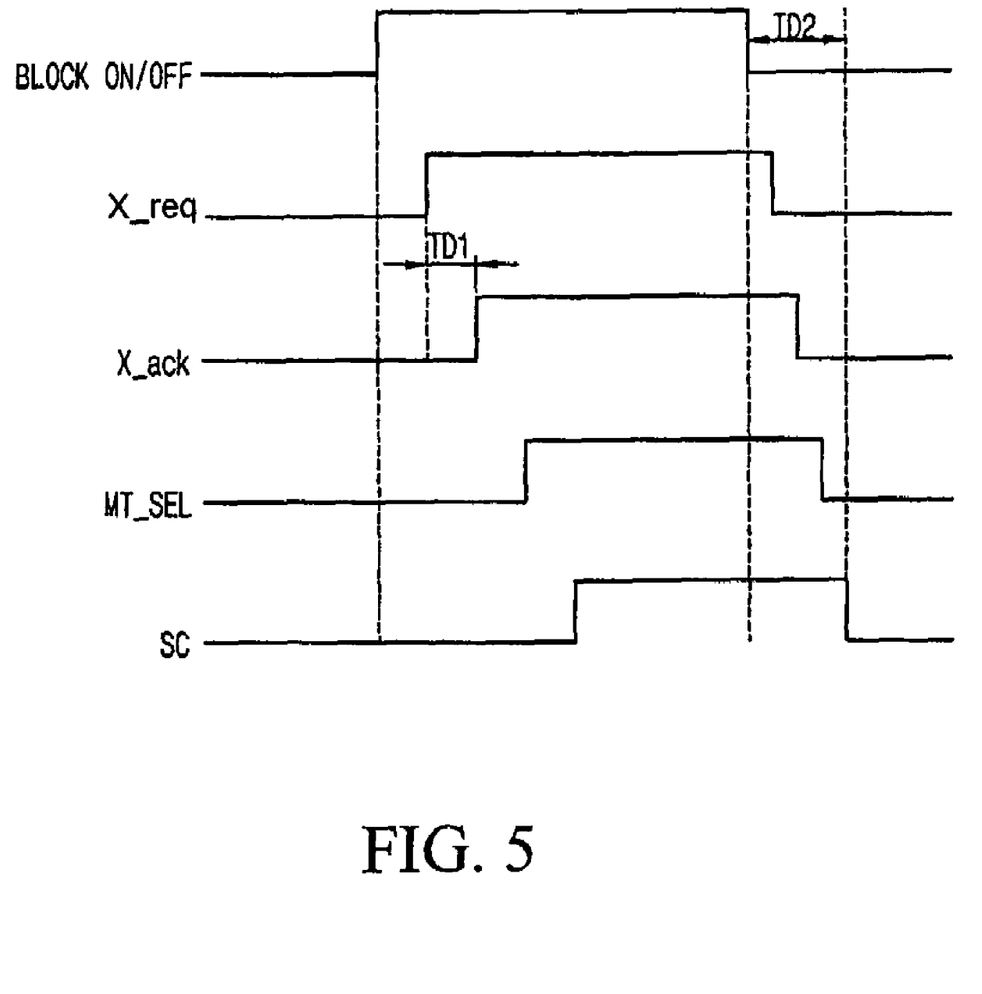
FIG. 5 illustrates a timing diagram for the block controller of FIG. 4 according to an embodiment of the present invention.

As can be seen in FIG. 5, when a block is to be deactivated, BLOCKi ON/OFF becomes logic high, X_reqi becomes logic high and X_acki becomes logic high after a time interval TD1, MT_SELi becomes high in response to X_acki and SCi becomes high for turning off the MOS switch 217. When a block is to be activated, BLOCKi ON/OFF becomes logic low, and X_reqi, X_acki, MT_SELi and SCi sequentially become logic low over a time interval TD2.

Figure 6:
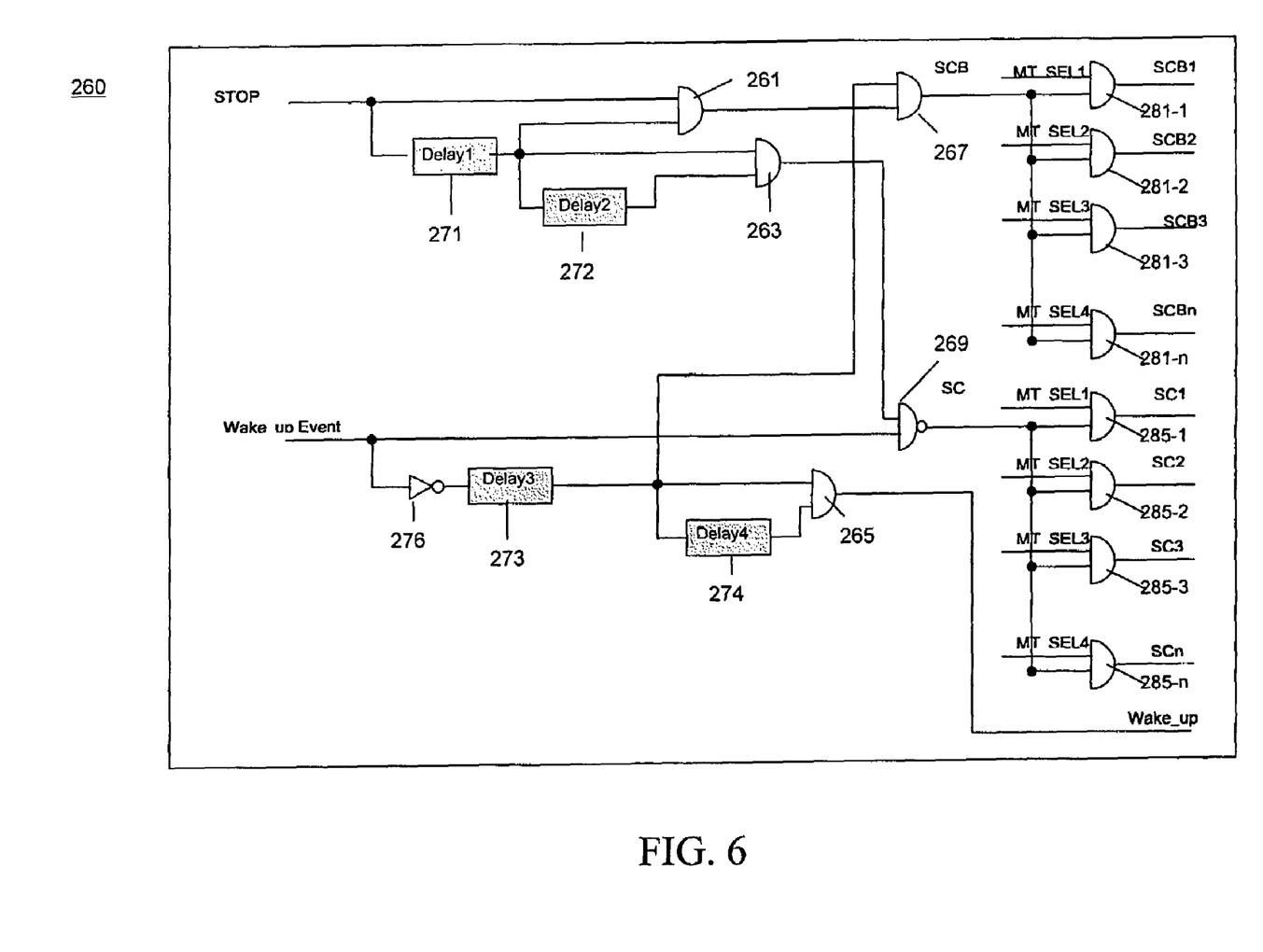
FIG. 6 illustrates a schematic diagram of the MTCMOS [STATE] controller of FIG. 2 according to an embodiment of the present invention.

A particular embodiment of the state controller 260 is shown in FIG. 6. The state controller 260 may include a plurality of AND gates 261, 263, 265, 267,281-1 to 281-n and 285-1 to 285-n, a NAND gate 269, a plurality of delay circuits 271-274 and an inverter 276.

STOP may be input to the MTCMOS[STATE] controller 260 from the power manager 220. A first AND gate 261 receives STOP and STOP having a first delay output by a first delay circuit 271. STOP having the first delay is also output to a second delay circuit 272. A second AND gate 263 receives STOP having the first delay and STOP having a second delay output by the second delay circuit 272.

A signal indicating a Wake-up Event (WE) is input to the MTCMOS[STATE] controller 260 from outside. The inverter 276 receives the WE and outputs an inverted WE (IWE) to a third delay circuit 273.

IWE having a third delay is output by the third delay circuit is output to a fourth delay circuit 274. A third AND gate 265 also receives IWE having the third delay and IWE having a fourth delay output by the fourth delay circuit 274. An output of the third AND gate 265 is WAKE-UP output to the power manager 220.

A fourth AND gate 267 receives the IWE having the third delay and an output of the first AND gate 261. An output of the fourth AND gate 267 is the inverted control signal SCB. The NAND gate 269 receives the WE and an output of the second AND gate 263. An output of the NAND gate 269 is the control signal SC.

AND gates 281-1 to 281-n respectively receive MT_SELi signals for each block output by the block controller 250 and SCB to determine SCBi for each block. AND gates 285-1 to 285-n respectively receive MT_SELi signals for each block output by the block controller 250 and SC to determine SCi for each block.

Figure 7:
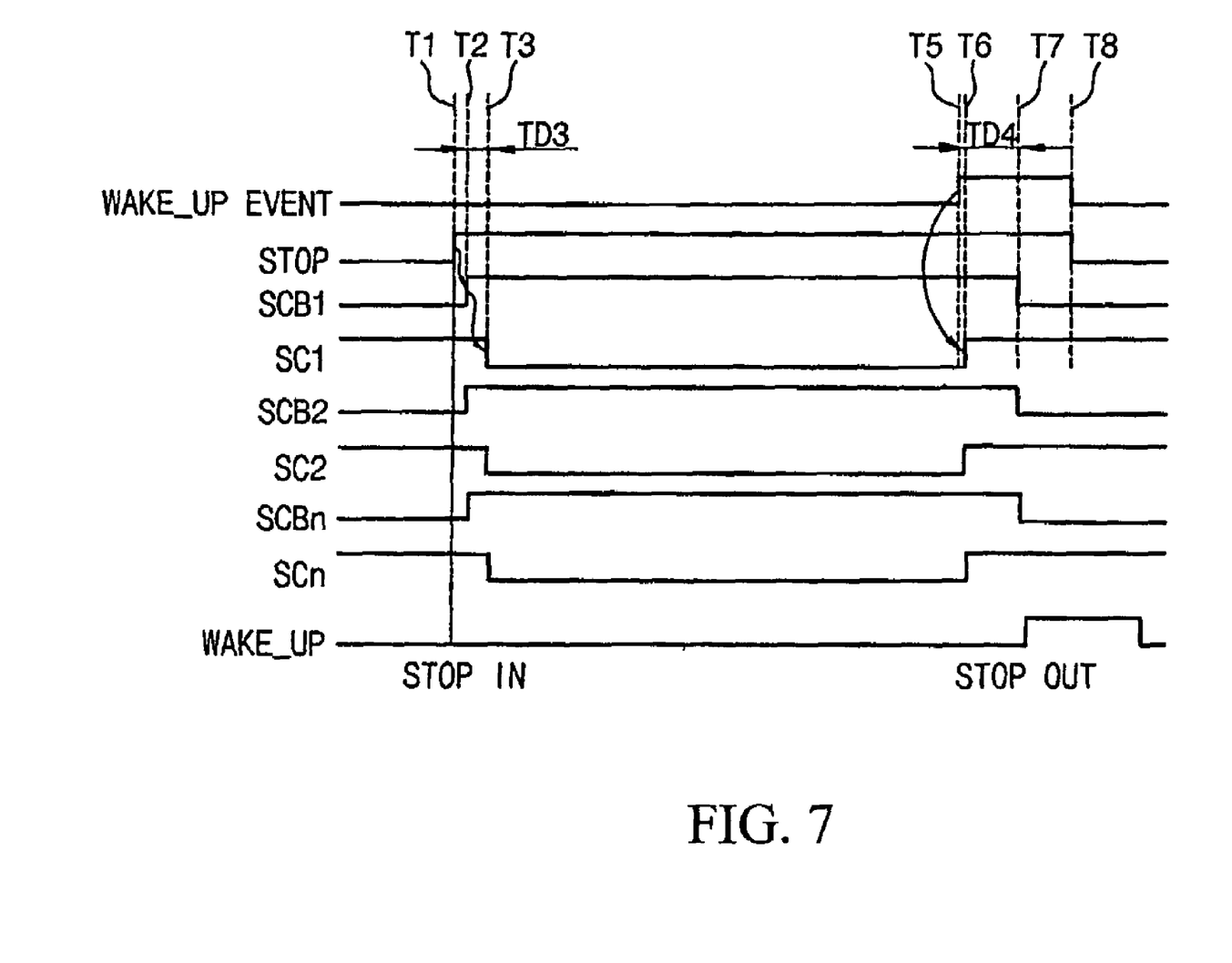
FIG. 7 illustrates a timing diagram for the MTCMOS [STATE] controller of FIG. 6 according to an embodiment of the present invention.

As can be seen in FIG. 7, when, for example, block1 is to enter standby mode, WE is low and STOP becomes high at time T1. SCB1 becomes high at time T2 and SCi becomes low at time T3. When, for example, block1 is to be activated, WE becomes high at time T5, SC1 becomes high at time T6 and SCB1 becomes low at time T7. The WE and STOP both become low at time T8.

Thus, when, for example, block1 is deactivated, a time interval TD3 between the change in state for SCB1 and SC1 is present using the first and second delay circuits 271, 272, allowing the data of the logic block 215-1 to be stored in F/F 211-1 before the MOS switch is turned OFF. When, for example, block1 is activated, a time interval TD4 may be present between the change in state for SC1 and SCB1, allowing the MOS switch to be turned on and data stored in F/F 211-1 to be restored in the logic block 215-1.

Figure 8:
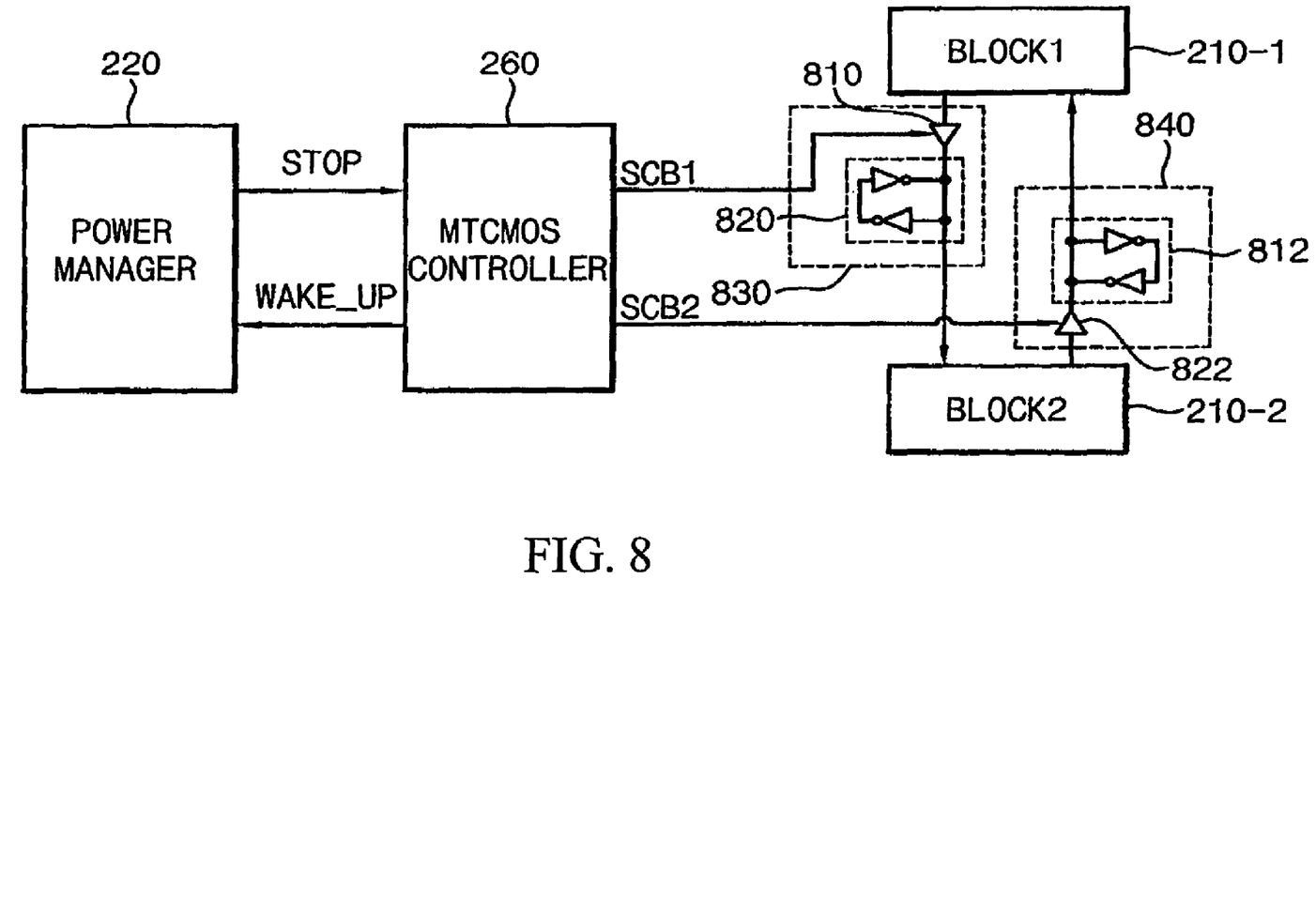
FIG. 8 illustrates a block diagram of a floating protection circuit between the blocks according to an embodiment of the present invention.

A pair of floating protection circuits may be provided between blocks. As shown in FIG. 8, a first floating protection circuit FPC1 830 may include a tri-state buffer 810 and a bus holder 820 and a second floating protection circuit FPC2 840 includes a tri-state buffer 822 and a bus holder 812. In the FPC1 830, the buffer holder 820 stores previous data from block 210-1 and the tri-state buffer 810 controls current flow between block 210-1 and block 210-2 in accordance with the control signal SCB1. In the FPC2 840, the buffer holder 822 stores previous data from block 210-2 and the tri-state buffer 822 controls current flow between block 210-2 and block 210-1 in accordance with the control signal SCB2.

Thus, each tri-state buffer receives an inverted individual control signal from the control circuit and an output of the logic circuit of a corresponding block and outputs the output of the logic circuit to the corresponding bus holder in accordance with the inverted individual control signal. When block1 210-1 is in a standby mode and block2 210-2 is active, the tri-state buffer 810 is in a high impedance state, the current path from block1 to block2 is cut off, the data is stored in the bus holder 820 and the leakage current resulting for the floated VGND of block1 is prevented.

Figure 9:
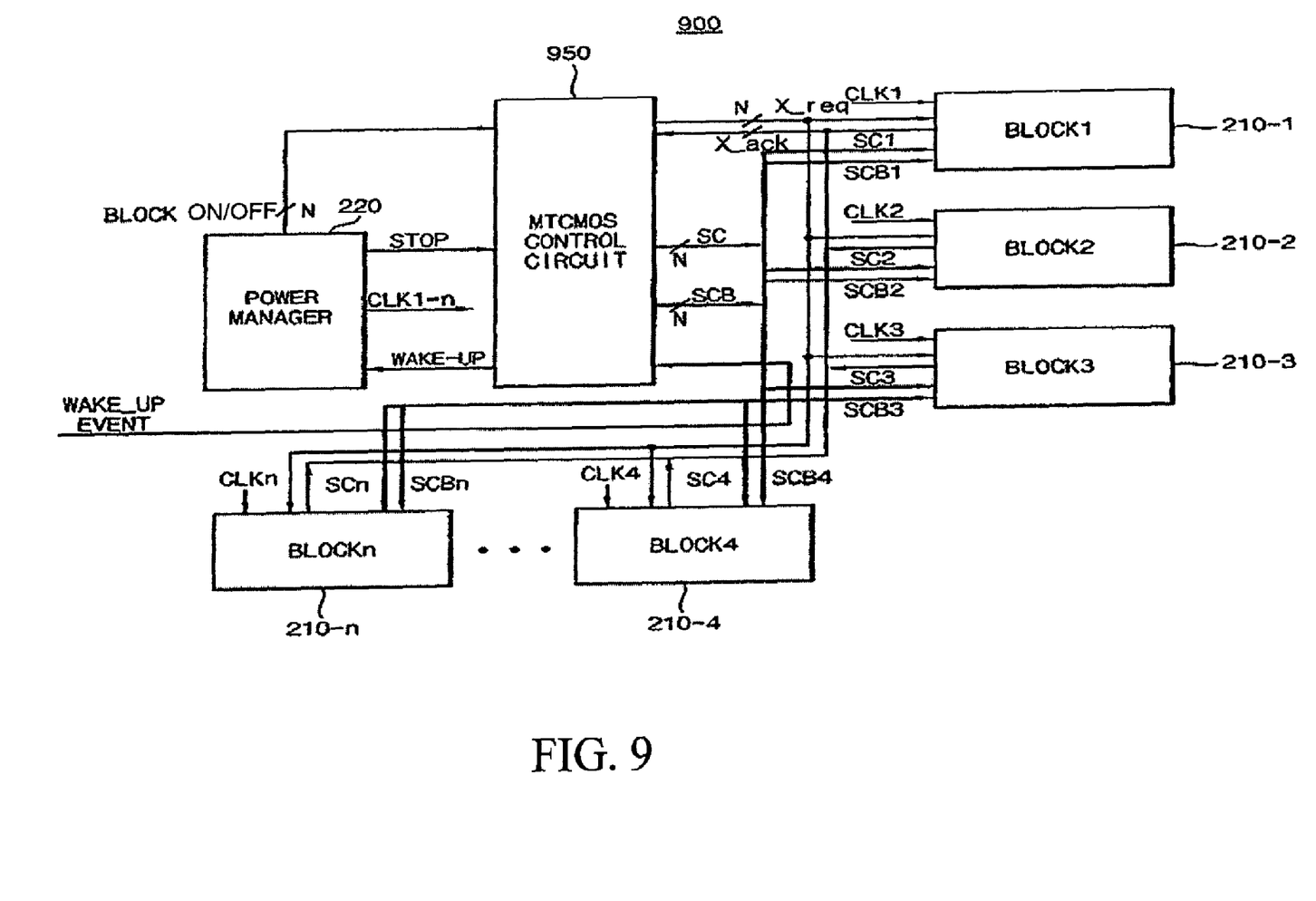
FIG. 9 illustrates a block diagram of an MTCMOS system according to another embodiment of the present invention.

An MTCMOS system 900 according to another embodiment of the present invention is illustrated in FIG. 9. The MTCMOS system 900 replaces the block controller 240 and the state controller 250 with an MTCMOS controller circuit 950 that generates the control signals SC and SCB in response to X_ack received from each respective block, without the use of MT_sel. In particular, the MTCMOS control circuit 950 sends X_req to a corresponding block in response to BLOCK ON/OFF output from the power manager 220 for the specified block. The corresponding block sends X_ack to the MTCMOS control circuit when it has finished a current operation. The MTCMOS control circuit sends SC and SCB to respective blocks in response to X_ack, rather than in response to MT_SEL as in the previous embodiment. Otherwise, the operation is the same.

Thus, an MTCMOS system in accordance with the present invention can reduce power consumption by separately controlling respective blocks. As used herein, a "block" may include more than one function block. While embodiments of the present invention have been described relative to a hardware implementation, the processing of present invention may be implemented in software, e.g., by an article of manufacture having a machine-accessible medium.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of controlling a plurality of blocks, each block including:
    a logic circuit having a logic transistor, and
    a control transistor connected between the logic circuit and a power line connected to one of a ground and a power source, the control transistor having a higher threshold than the logic transistor, the method comprising:
    generating an individual block ON/OFF signal for each block;
    generating an individual control signal in response to the individual block ON/OFF signal;
    supplying the individual control signal to the control transistor; and
    controlling a voltage supplied to the logic circuit within each block in accordance with the individual control signal, wherein supplying the individual control signal is in response to a wake-up event.

2. The method as claimed in claim 1, further comprising:
    buffering, using a buffer in parallel with each block, an output of the logic circuit; and
    controlling buffering in accordance with an inverted individual control signal.

3. The method as claimed in claim 2, further comprising:
    delaying the inverted individual control signal relative to the individual control signal when the block is to be turned ON; and
    delaying the individual control signal relative to the inverted individual control signal when the block is to be turned OFF.

4. The method as claimed in claim 1, further comprising, before outputting the individual control signal:
    sending a request signal to a corresponding block in response to the individual block ON/OFF signal; and
    sending a response signal from the corresponding block when it is ready to receive the individual control signal.

5. The method as claimed in claim 4, further comprising:
    generating a block select signal in accordance with the response signal; and
    controlling generating the individual control signal in accordance with the block select signal.

6. The method as claimed in claim 1, further comprising, when a block is in an OFF state, preventing leakage current from the block from affecting other blocks.

7. The method as claimed in claim 6, further comprising supplying an output of the logic circuit of the block to a bus holder when the block is in an OFF state.

8. The method as claimed in claim 7, further comprising controlling supplying the output of the logic circuit in accordance with an inverted individual control signal.

9. A system, comprising:
    a plurality of blocks, each block including:
        a logic circuit having a logic transistor, and
        a control transistor connected between the logic circuit and a power line connected to one of a ground and a power source, the control transistor having a higher threshold than the logic transistor;
    a power manager for outputting an individual block ON/OFF signal for each block; and
    a control circuit for receiving the individual block ON/OFF signal for each block and for outputting an individual control signal to the control transistor in that block to control voltage supply to the logic circuit, wherein the control circuit outputs the individual control signal in response to a wake-up event.

10. The system as claimed in claim 9, wherein each block further comprises a buffer in parallel with the logic circuit, and the control circuit further outputs an inverted individual control signal to the buffer.

11. The system as claimed in claim 10, further comprising:
    a first delay for delaying the inverted individual control signal relative to the individual control signal when the block is to be turned ON; and
    a second delay for delaying the individual control signal relative to the inverted individual control signal when the block is to be turned OFF.

12. The system as claimed in claim 9, wherein the control circuit, before outputting the individual control signal, further outputs a request signal to a corresponding block in response to the individual block ON/OFF signal and each block sends a response signal when it is ready to receive the individual control signal.

13. The system as claimed in claim 12, wherein the control circuit further comprises:
    a block controller, receiving the individual block ON/OFF signals from the power manager, for sending the request signal to the corresponding block, receiving the response signal from the corresponding block, and outputting a block select signal; and
    a state controller, receiving the block select signal, for outputting the individual control signal in accordance with the block select signal.

14. The system as claimed in claim 9,
    wherein the control cicuit further outputs a wake-up signal to the power manager in response to the wake-up event, after the output of the individual control signal.

15. The system as claimed in claim 9, further comprising a floating protection circuit associated with a block.

16. The system as claimed in claim 15, wherein the floating protection circuit comprises:
    a tri-state buffer receiving an inverted individual control signal from the control circuit and an output of the logic circuit of a corresponding block and outputting the output of the logic circuit in accordance with the inverted individual control signal; and
    a bus holder receiving the output of the tri-state buffer.

17. The system as claimed in claim 9, further comprising pair of floating protection circuits between adjacent blocks.

18. The system as claimed in claim 17, wherein each floating protection circuit comprises:
    a tri-state buffer receiving an inverted individual control signal from the control circuit and an output of the logic circuit of a corresponding block and outputting the output of the logic circuit in accordance with the inverted individual control signal; and
    a bus holder receiving the output of the tri-state buffer.

19. A system for protecting first and second blocks, each block including a logic circuit and having ON/OFF states which are individually controlled, the system being between the first and second blocks, the system comprising:
    a first tri-state buffer for receiving a first output of the logic circuit of the first block and a first inverted control signal for the first block, and outputting the first output in accordance with the first inverted control signal;

a first bus holder for receiving the output of the first tri-state buffer;

a second tri-state buffer for receiving a second output of the logic circuit of the second block and a second inverted control signal for the second block, and outputting the second output in accordance with the second inverted control signal; and a second bus holder for receiving the output of the second tri-state buffer.

20. A method of controlling a plurality of blocks, each block including:

a logic circuit having a logic transistor, and a control transistor connected between the logic circuit and a power line connected to one of a ground and a power source, the control transistor having a higher threshold than the logic transistor, the method comprising:

generating an individual block ON/OFF signal for each block;

generating an individual control signal in response to the individual block ON/OFF signal;

supplying the individual control signal to the control transistor;

controlling a voltage supplied to the logic circuit within each block in accordance with the individual control signal;

providing, for each block, a buffer in parallel with the logic circuit; and supplying an inverted individual control signal to each buffer.

21. A system, comprising:

a plurality of blocks, each block including:
    a logic circuit having a logic transistor, and
    a control transistor connected between the logic circuit and a power line connected to one of a ground and a power source, the control transistor having a higher threshold than the logic transistor;

a power manager for outputting an individual block ON/OFF signal for each block; and a control circuit for receiving the individual block ON/OFF signal for each block and for outputting an individual control signal to the control transistor in that block to control voltage supply to the logic circuit, wherein:

each block further includes a buffer in parallel with the logic circuit, and the control circuit further outputs an inverted individual control signal to the buffer.

22. A method of controlling a plurality of blocks, each block including:

a logic circuit having a logic transistor, and a control transistor connected between the logic circuit and a power line connected to one of a ground and a power source, the control transistor having a higher threshold than the logic transistor, the method comprising:

generating an individual block ON/OFF signal for each block;

generating an individual control signal in response to the individual block ON/OFF signal;

supplying the individual control signal to the control transistor;

controlling a voltage supplied to the logic circuit within each block in accordance with the individual control signal; and supplying an output of the logic circuit of the block to a bus holder when the block is in an OFF state.

23. A system, comprising:

a plurality of blocks, each block including:
    a logic circuit having a logic transistor, and
    a control transistor connected between the logic circuit and a power line connected to one of a ground and a power source, the control transistor having a higher threshold than the logic transistor;

a power manager for outputting an individual block ON/OFF signal for each block;

a control circuit for receiving the individual block ON/OFF signal for each block and for outputting an individual control signal to the control transistor in that block to control voltage supply to the logic circuit; and a floating protection circuit associated with a block.

24. The system as claimed in claim 23, wherein the floating protection circuit comprises:

a tri-state buffer receiving an inverted individual control signal from the control circuit and an output of the logic circuit of a corresponding block and outputting the output of the logic circuit in accordance with the inverted individual control signal; and a bus holder receiving the output of the tri-state buffer.

* * * * *